United States Patent
Takeya et al.

(10) Patent No.: US 10,050,026 B2
(45) Date of Patent: Aug. 14, 2018

(54) DISPLAY APPARATUS

(71) Applicant: Seoul Semiconductor Co., Ltd., Ansan-si (KR)

(72) Inventors: Motonobu Takeya, Ansan-si (KR); Young Hyun Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 15/395,490

(22) Filed: Dec. 30, 2016

(65) Prior Publication Data

US 2017/0194304 A1    Jul. 6, 2017

Related U.S. Application Data

(60) Provisional application No. 62/273,656, filed on Dec. 31, 2015.

(51) Int. Cl.
*H01L 29/20* (2006.01)
*H01L 25/16* (2006.01)
(Continued)

(52) U.S. Cl.
CPC .......... *H01L 25/167* (2013.01); *H01L 25/162* (2013.01); *H01L 27/1218* (2013.01);
(Continued)

(58) Field of Classification Search
CPC . H01L 25/167; H01L 25/162; H01L 27/1218; H01L 33/504; H01L 33/505; H01L 33/62
See application file for complete search history.

(56) References Cited

U.S. PATENT DOCUMENTS 6,965,361 B1 * 11/2005 Sheats ................. H01L 27/3251
                                                                340/815.45
2008/0246902 A1 * 10/2008 Cheng ............... G02F 1/133617
                                                                349/69
(Continued)

FOREIGN PATENT DOCUMENTS

KR    10-2012-0050282    5/2012
KR    10-2013-0008892    1/2013
(Continued)

OTHER PUBLICATIONS

International Search Report dated Apr. 4, 2017, for PCT Application No. PCT/KR2016/015390.
(Continued)

*Primary Examiner* — Syed Gheyas
(74) *Attorney, Agent, or Firm* — H.C. Park & Associates, PLC

(57) ABSTRACT

A display apparatus includes a light emitting diode part and a thin film (TFT) panel configured to drive the light emitting diode part. The light emitting diode part includes a transparent support substrate, a plurality of light emitting diodes, a plurality of phosphor layers disposed on the support substrate covering at a first portion of the plurality of light emitting diodes and configured to emit light through a conversion of introduced light. Another display apparatus includes a light emitting diode part including a plurality of light emitting diodes and a TFT panel configured to drive the light emitting diode part. The TFT panel includes a panel substrate including a TFT driving circuit and a plurality of grooves formed on the panel substrate. The TFT panel also includes a plurality of phosphor layers the plurality of grooves and configured to emit light through wavelength conversion of introduced light.

8 Claims, 13 Drawing Sheets

(51) Int. Cl.
    *H01L 33/50*    (2010.01)
    *H01L 33/62*    (2010.01)
    *H01L 27/12*    (2006.01)

(52) U.S. Cl.
    CPC .......... *H01L 33/504* (2013.01); *H01L 33/505* (2013.01); *H01L 33/62* (2013.01)

(56) References Cited

U.S. PATENT DOCUMENTS

| | | | |
|---|---|---|---|
| 2010/0277887 A1* | 11/2010 | Su | H01L 33/44 362/19 |
| 2012/0112229 A1 | 5/2012 | Park et al. | |
| 2014/0362603 A1 | 12/2014 | Song et al. | |
| 2015/0102291 A1 | 4/2015 | Park et al. | |
| 2015/0372052 A1* | 12/2015 | Bower | G09G 3/32 257/88 |

FOREIGN PATENT DOCUMENTS

| | | |
|---|---|---|
| KR | 10-2015-0042367 | 4/2015 |
| KR | 10-2015-0066186 | 6/2015 |

OTHER PUBLICATIONS

Written Opinion dated Apr. 4, 2017, for PCT Application No. PCT/KR2016/015390.

* cited by examiner

DISPLAY APPARATUS

CROSS REFERENCE TO RELATED APPLICATION

This application claims the benefit of U.S. Provisional Patent Application No. 62/273,656, filed on Dec. 31, 2015, which is hereby incorporated by reference for all purposes as if fully set forth herein.

BACKGROUND

Field

Exemplary embodiments of the present disclosure relate to a display apparatus and, more particularly, to a display apparatus using micro-light emitting diodes.

Discussion of the Background

Consumer demand has been trending toward display that consume less power to extend the battery life of their electronic devices or reduce the amount of power a particular apparatus display apparatus requires from the grid. However, conventional display devices such a liquid crystal display or organic light emitting diode (OLED) require high power consumption to drive these conventional display. In addition, these conventional displays often suffer from inaccurate color contrast, low response time for generating images, high production cost, short lifespan, or uneven brightness of various sub-pixels. Therefore, there is a need for an efficient display apparatus with accurate color contrast, high response time, low production cost, long lifespan, and even brightness levels of the various sub-pixels or pixels.

The above information disclosed in this Background section is only for enhancement of understanding of the background of the inventive concept, and therefore, it may contain information that does not form the prior art that is already known in this country to a person of ordinary skill in the art.

SUMMARY

Exemplary embodiments of the present disclosure provide a display apparatus employing micro-light emitting diodes having low power consumption high resolution and applicable to a wearable apparatus, smartphone, television, or monitor.

In one or more exemplary embodiments, a display apparatus includes a light emitting diode part including a transparent support substrate, a plurality of light emitting diodes regularly arranged on the support substrate, a plurality of phosphor layers disposed on the support substrate covering at a first portion of the plurality of light emitting diodes and configured to emit light through a conversion of introduced light. The display apparatus also includes a TFT panel configured to drive the light emitting diode part.

In one or more exemplary embodiments, a display apparatus includes a light emitting diode part including a plurality of light emitting diodes regularly arranged and a thin film transistor (TFT) panel configured to drive the light emitting diode part. The TFT panel includes a panel substrate including a TFT driving circuit and comprises a plurality of grooves formed on the panel substrate. The TFT pane includes a plurality of phosphor layers filling the plurality of grooves formed on the panel substrate and configured to emit light through wavelength conversion of introduced light.

According to exemplary embodiments, the display apparatus employs micro-light emitting diodes comprising nitride semiconductors, thereby realizing high efficiency and high resolution.

The foregoing general description and the following detailed description are exemplary and explanatory and are intended to provide further explanation of the claimed subject matter.

BRIEF DESCRIPTION OF DRAWINGS

The accompanying drawings, which are included to provide a further understanding of the invention and are incorporated in and constitute a part of this specification, illustrate embodiments of the invention, and together with the description serve to explain the principles of the inventive concept.

DETAILED DESCRIPTION OF ILLUSTRATED EMBODIMENTS

Figure 1:
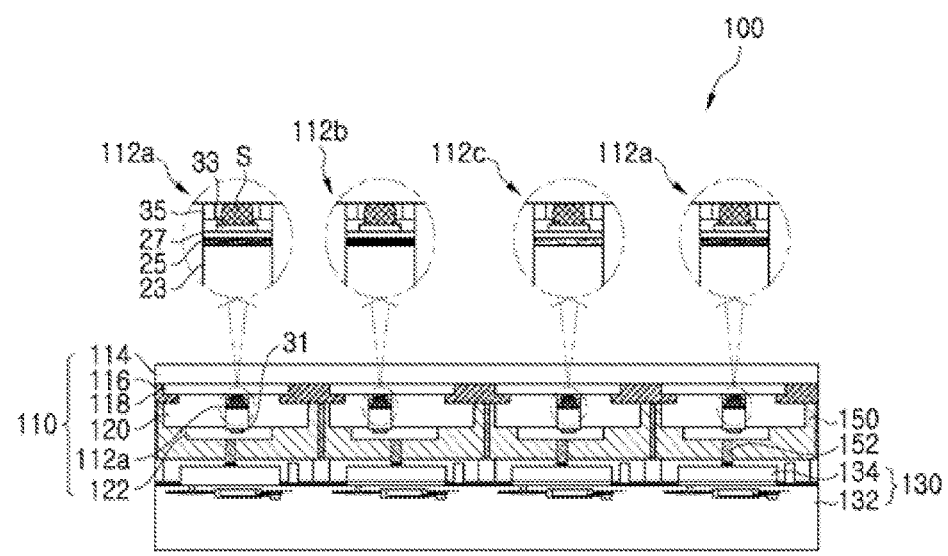
FIG. 1 is a sectional view of a display apparatus according to a first exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of pixels, panels, regions, area, portions, etc., may be exaggerated for clarity and descriptive purposes. Also, like reference numerals denote like elements.

Unless otherwise specified, the illustrated exemplary embodiments are to be understood as providing exemplary features of varying detail of various exemplary embodiments. Therefore, unless otherwise specified, the features, blocks, components, elements, and/or aspects of the various illustrations may be otherwise combined, separated, interchanged, and/or rearranged without departing from the disclosed exemplary embodiments. Further, in the accompanying figures, the size and relative sizes of blocks, components, elements, etc., may be exaggerated for clarity and descriptive purposes.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, portions, areas, and/or sections, these elements, components, regions, portions, areas, and/or sections should not be limited by these terms. These terms are used to distinguish one element, component, region, portion, area, and/or section from another element, component, region, portion, area, and/or section. Thus, a first element, component, region, and/or section discussed below could be termed a second element, component, region, portion, area, and/or section without departing from the teachings of the present disclosure.

Spatially relative terms, such as "beneath," "below," "lower," "above," "upper," "end," "inside," "left," "right," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A light emitting diode (LED) refers to an inorganic semiconductor device that emits light through recombination of electrons and holes, and has been used in various fields including displays, car lamps, general lighting, and the like. The light emitting diode has many advantages such as a long lifespan, low power consumption, and rapid response time. A light emitting device using such a light emitting diode is used as a light source in various fields.

Recently, television or monitors tend to reproduce colors using thin film transistor liquid crystal display (TFT-LCD) panels and employ light emitting diodes as backlight sources for color reproduction. However, since one LED is used as a light source for multiple pixels and sub-pixels, a backlight source is always turned on. Therefore, power consumption is constant regardless of whether a displayed screen is bright or dark. In order to compensate for this problem, there is a display apparatus which divides the screen into several zones and controls contrast thereof. However, since the screen is divided into units consisting of thousands to tens of thousands of pixels, it is difficult to achieve accurate control of contrast while reducing power consumption.

Even more recently, display devices have begun using organic light emitting diode (OLED) to directly emitting light for each sub-pixel. Although power consumption of OLEDs has been continuously reduced over time, power consumption of OLEDs is still much larger than that of inorganic semiconductor based-devices or LEDs. Thus, OLEDs have low efficiency.

In addition, pulse modulation-driven (PM-driven) OLEDs can suffer from a low response time in generating images due to Pulse Amplifier Modulation (PAM) control of a large capacity OLED. PM-driven OLED also suffer from short lifespan due to the high current driving required for pulse width modulation (PWM) control for realizing low duty of the OLEDs. When an OLED device is driven by an AM driving method, it is necessary to connect TFTs to each pixel, thereby causing increase in production costs and uneven brightness depending upon TFT characteristics.

According to one or more exemplary embodiments described below, the display apparatus employs micro-light emitting diodes including nitride semiconductors, thereby realizing high efficiency and high resolution suitable for wearable apparatus, smartphone, television, or monitor.

One or more exemplary embodiments described below are configured such that 1000 or less pixels correspond to one light emitting diode, whereby a light emitting diode corresponding to pixels not requiring light can be turned off, thereby enabling accurate control of contrast while reducing power consumption.

Furthermore, according to one or more exemplary embodiments, the display apparatus is manufactured using a stretchable substrate and thus can be more conveniently manufactured in manufacture of the display apparatus using micro-light emitting diodes.

Accordingly, energy efficiency display apparatuses with accurate color contrast, high response time, low production cost, long lifespan, and even brightness levels compared to conventional LCD or OLED display devices and manufacturing methods of these energy efficient display apparatuses are described below with respect to various exemplary embodiments and accompanying drawings.

Figure 2:
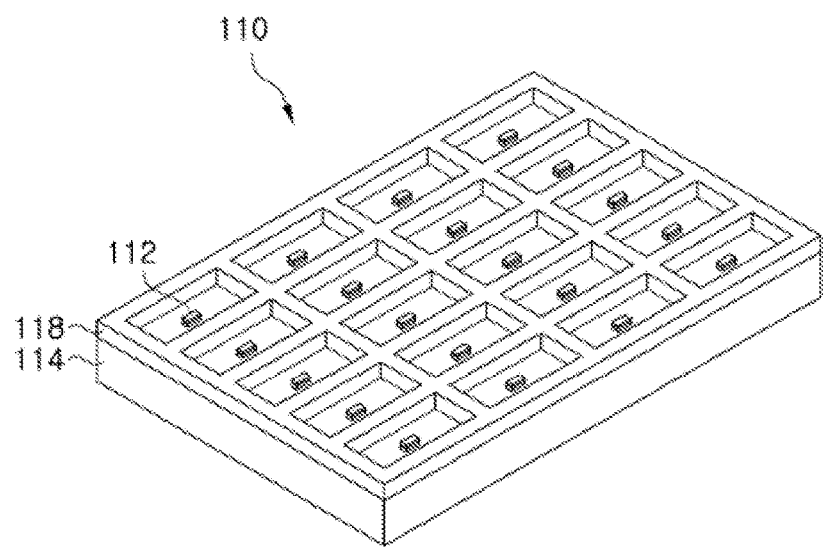
FIG. 2 is a perspective view of a light emitting diode part of the display apparatus according to the first exemplary embodiment of the present disclosure.

FIG. 1 is a sectional view of a display apparatus according to a first exemplary embodiment of the present disclosure and FIG. 2 is a perspective view of a light emitting diode part of the display apparatus according to the first exemplary embodiment of the present disclosure.

Referring to FIG. 1, the display apparatus 100 according to the first exemplary embodiment includes a light emitting diode part 110, a TFT panel unit 130, and an anisotropic conductive film 150.

Referring to FIG. 1 and FIG. 2, the light emitting diode part 110 includes light emitting diodes 112, a support substrate 114, a transparent electrode 116, a blocking portion 118, an insulation layer 120, and a first connection electrode 122. FIG. 1 is flipped upside down (e.g., rotated 180 degrees) when compared to FIG. 2.

A plurality of light emitting diodes 112 are regularly arranged on the support substrate 114. For example, the plurality of light emitting diodes 112 may be arranged in a matrix, as shown in FIG. 2. In this exemplary embodiment, the plurality of light emitting diodes 112 includes a plurality of blue light emitting diodes 112a, a plurality of green light emitting diodes 112b, and a plurality of red light emitting diodes 112c. The plurality of blue light emitting diodes 112a, the plurality of green light emitting diodes 112b and the plurality of red light emitting diodes 112c are alternately arranged such that the blue light emitting diode 112a, the green light emitting diode 112b, and the red light emitting diode 112c are adjacent one another. For example, a red LED 112c is adjacent to a first blue LED 112a on first side of the first blue LED 112a and a green LED 112b is adjacent to the first blue LED 112a on a second side of the first blue LED 112a.

In this exemplary embodiment, as shown in FIG. 2, the light emitting diode part 110 may be driven in the display apparatus 100 by an external power source. Put another way, a display apparatus 100 may generate an image by turning the plurality of light emitting diodes 112 of the light emitting diode part 110 on or off in various combinations without a separate LCD acting as a shutter or polarizer of light. The display apparatus 100 may also generate images without the use of color filters. Accordingly, a region including one light emitting diode 112 may be used as one sub-pixel in the display apparatus 100. As shown in FIG. 2, the size of one sub-pixel in the light emitting diode part 110 may be larger than the size of the light emitting diode 112 disposed in the sub-pixel.

Referring again to FIG. 1, each of the light emitting diodes 112 may include an n-type semiconductor layer 23, an active layer 25, a p-type semiconductor layer 27, an n-type electrode 31, a p-type electrode 33, and a wall portion 35. The n-type semiconductor layer 23, the active layer 25, and the p-type semiconductor layer 27 may include a group III-V compound semiconductor. For example, a nitride semiconductor may be used as the n-type semiconductor layer 23, the active layer 25, and the p-type semiconductor layer 27. The nitride semiconductor layer may include aluminum (Al), gallium (Ga), indium (In), or some combination thereof in varying concentrations with nitrogen (N) for the n-type semiconductor layer 23, the active layer 25, and the p-type semiconductor layer 27. Some combinations of include AlN, AlGaN, GaN, InN, InGaN, or InGaAlN. Although the p-type semiconductor layer 27 is arranged closer to the support substrate 114 than the n-type semiconductor layer 23 in FIG. 1, the relative position of semiconductor layers 27 and 23 may be interchanged along with their associated n-type electrode 31 and p-type electrode 33.

The n-type semiconductor layer 23 may include an n-type dopant (e.g., Si) and the p-type semiconductor layer 27 may include a p-type dopant (e.g., Mg). The active layer 25 may have a multi-quantum well (MQW) structure and the composition of the active layer may be determined so as to emit light having a desired peak wavelength.

The light emitting structure including the n-type semiconductor layer 23, the active layer 25, and the p-type semiconductor layer 27 may be formed similar to a vertical light emitting diode. In this structure, the n-type electrode 31 is formed on an outer surface of the n-type semiconductor layer 23 and the p-type electrode 33 is formed on an outer surface of the p-type semiconductor layer 27. The outer surface of the n-type semiconductor layer 23 and the p-type semiconductor layer 27 is a surface that faces away from the active layer 25.

In addition, as shown in FIG. 1, a bonding portion S may be formed between the p-type electrode 33 and the transparent electrode 116 in order to bond the light emitting diode 112 to the transparent electrode 116 of the support substrate 114, and the wall portion 35 may be formed in order to prevent the bonding portion S from deviating between the p-type electrode 33 and the transparent electrode 116. In other words, the wall portion 35 helps retain the bonding portion S between the p-type electrode and the transparent electrode 116.

Here, the bonding portion S may include a pure metal or a metal alloy and provides a site for bonding through a process of metal diffusion bonding or eutectic bonding. The bonding portion S for metal diffusion bonding may include at least one of Cuto-Cu, Au-to-Au, Ti-to-Ti/Si, and Al-to-Al. The bonding portion S for eutectic bonding may include at least one of Au/In, Cu/Sn, Au/Sn, Au/Si, Au/Ge, and Al/Ge.

The wall portion 35 may be formed to cover a portion of the p-type electrode 33 to expose the p-type electrode 33 on the p-type semiconductor layer 27. The wall portion 35 may be composed of a plurality of layers as shown in FIG. 1. The wall portion 35 may include a first layer including silicon nitride (SiN) is formed to cover a portion of the p-type electrode 33 on the p-type semiconductor layer 27 and a second layer including silicon dioxide ($SiO_2$) is then formed on the first layer. The second layer may be thicker than the first layer. The second layer may cover less surface area of the p-type semiconductor layer 27 than the first layer. Put another way, the second layer may have a narrow horizontal width when compared to a horizontal width of the first layer in the cross-sectional view of FIG. 1

The display apparatus includes the support substrate 114. The plurality of light emitting diodes 112 are mounted on the support substrate 114. The support substrate 114 may be an insulating substrate, a conductive substrate, or a printed circuit board. For example, the support substrate 114 may be at least one of a sapphire substrate, a gallium nitride substrate, a glass substrate, a silicon carbide substrate, a silicon substrate, a metal substrate, and a ceramic substrate. In addition, a plurality of conductive patterns, which may be electrically connected to the plurality of light emitting diodes 112, may be formed on the support substrate 114 or a circuit pattern may be formed therein, as needed. Further, the support substrate 114 may be a flexible substrate.

The transparent electrode 116 is formed on the support substrate 114 and may be electrically connected to the p-type electrode 33 of the light emitting diode 112. In this embodiment, a plurality of transparent electrodes 116 may be formed on the support substrate 114. Here, one light emitting diode 112 may be coupled to one transparent electrode 116 and a plurality of light emitting diodes 112 may be coupled to the a plurality of transparent electrodes 116. Further, the plurality of transparent electrodes 116 may be spaced apart from one another on the support substrate 114. For example, the plurality of transparent electrodes 116 may be formed of ITO.

The blocking portion 118 is formed on the support substrate 114. A plurality of blocking portions 118 may be formed on the support substrate. The blocking portion 118 serves to prevent light emitted from the light emitting diode 112 from being emitted to undesired locations. For example, the blocking portion 118 is selectively located to block light from one light emitting diode 112 from being mixed with light emitted from an adjacent light emitting diode 112. As another example, the blocking portion 118 is not located directly over the light emitting diode 112 to allow the light emitted from the light emitting diode 112 to travel through the transparent electrode 116. Accordingly, the blocking portion 118 may be formed between adjacent transparent electrodes 116. A plurality of blocking portions 118 may be spaced apart from each other and may be formed to cover a portion of the transparent electrode 116. In this exemplary embodiment, the blocking portion 118 may be formed of chromium (Cr).

The insulation layer 120 is formed to surround the light emitting diode 112 and cover an exposed region of a surface to which the light emitting diode 112 is coupled (e.g., a surface of the transparent electrode 116 or a surface of the first connection electrode 122). Accordingly, the insulation layer 120 may be formed to cover a portion of the blocking portion 118. As the insulation layer 120 is formed to surround the light emitting diode 112, the n-type semiconductor layer 23 and the n-type electrode 31 of the light emitting diode 112 can be exposed through the insulation layer 120.

The first connection electrode 122 is formed to cover the insulation layer 120 and may be formed to cover the n-type semiconductor layer 23 and the n-type electrode 31 not covered by the insulation layer 120. Accordingly, the first connection electrode 122 may be electrically connected to the n-type semiconductor layer 23.

The TFT panel 130 includes a panel substrate 132 and a second connection electrode 134. The TFT panel 130 is coupled to the light emitting diode part 110 and serves to supply electric power to the light emitting diode part 110. In addition, the TFT panel 130 controls the electric power supplied to the light emitting diode part 110 to allow only some of the plurality of light emitting diodes 112 in the light emitting diode part 110 to emit light. For example, the TFT panel 130 may control the electrical power to supply light to only one, two, three, or more light emitting diodes 112 without supplying power to all of the light emitting diodes 112 of the light emitting diode part 110.

The panel substrate 132 may have a TFT driving circuit formed therein. The TFT driving circuit may be a circuit for driving an active matrix (AM) or a circuit for driving a passive matrix (PM).

The second connection electrode 134 may be electrically connected to the TFT driving circuit of the panel substrate 132 and may be electrically connected to the first connection electrode 122 of the light emitting diode part 110. Accordingly, electric power supplied through the TFT driving circuit can be supplied to each light emitting diode 112 through the first and second connection electrodes 122, 134. At this time, the second connection electrode 134 may be covered by a separate protective layer and the protective layer may include silicon nitride ($SiN_x$).

The anisotropic conductive film 150 serves to electrically connect the light emitting diode part 110 and the TFT panel 130 to each other. The anisotropic conductive film 150 includes an adhesive organic material having an insulating property and conductive particles for electrical connection uniformly dispersed therein. The anisotropic conductive film 150 is conductive in a first direction (e.g., the vertical direction in FIG. 1) and in a second direction (e.g., the horizontal direction in FIG. 1). In addition, the anisotropic conductive film 150 has bonding properties to bond the TFT panel 130 to the light emitting diode part 110 which needs to be electrically connected. In particular, the anisotropic conductive film 150 can be useful for connecting electrodes, which are difficult to solder at high temperature, such as ITO.

As such, when the light emitting diode part 110 and the TFT panel 130 are coupled via the anisotropic conductive film 150, the first connection electrode 122 of the light emitting diode part 110 and the second connection electrode 134 of the TFT panel 130 are electrically connected to each other to form an electrode connection portion 152.

Figure 3A:
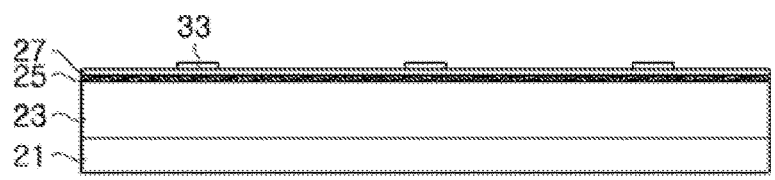
FIGS. 3A, 3B, 3C, 3D, 3E, 3F, 3G, 3H, 3I, 3J, 3K, 3L, 3M, 3N, 3O, 3P are sectional views illustrating a method of manufacturing the light emitting diode part of the display apparatus according to the first exemplary embodiment of the present disclosure.

FIGS. 3A, 3B, 3C, 3D, 3E, 3F, 3G, 3H, 3I, 3J, 3K, 3L, 3M, 3N, 3O, and 3P are sectional views illustrating a method of manufacturing the light emitting diode part 110 of the display apparatus 100 according to the first exemplary embodiment of the present disclosure. FIGS. 4A, 4B, 4C, 4D, 4E, 4F, and 4G are plan views illustrating a method of manufacturing the light emitting diode part 110 of the display apparatus 100 according to the first exemplary embodiment of the present disclosure Referring to FIG. 3A-3P and FIGS. 4A-4G, a process of manufacturing the light emitting diode part 110 will be described. As shown in FIG. 3A, an n-type semiconductor layer 23, an active layer 25, and a p-type semiconductor layer 27 are sequentially grown on a growth substrate 21. Then, a plurality of p-type electrodes 33 are formed on the p-type semiconductor layer 27. The plurality of p-type electrodes 33 may be separated a predetermined distance from each other such that one p-type electrode 33 can be provided to one light emitting diode 112.

Figure 3B:
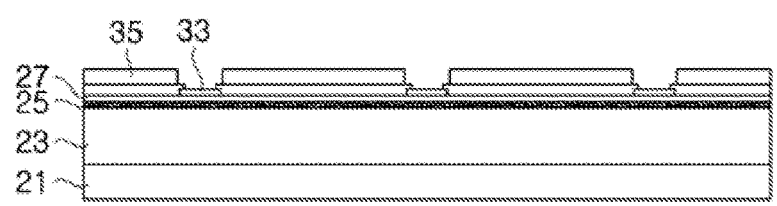

Referring to FIG. 3B, a wall portion 35 is formed on the p-type semiconductor layer 27 on which the p-type electrodes 33 are formed. The wall portion 35 may be composed of two layers. The first layer of the wall portion 35 is formed to cover the entirety of the p-type semiconductor layer 27 while covering a portion of the p-type electrode 33. The first layer of the wall portion 35 contains silicon nitride (SiN). In addition, a second layer of the wall portion 35 contains silicon dioxide ($SiO_2$) and is formed on the first layer. In this exemplary embodiment, the second layer may be formed thicker than the first layer and may be formed on the first layer in a region in which the p-type electrodes 33 are not formed.

Figure 3C:
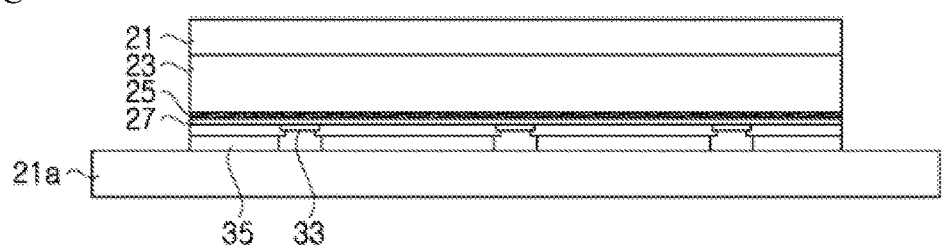

Referring to FIG. 3C, with the wall portion 35 formed as described above, the semiconductor layers 23, 25, and 27 are bonded to a first substrate. In this exemplary embodiment, the second layer of the wall portion 35 is coupled to the first substrate 21a. The first substrate 21a may be a substrate such as the support substrate 114. The first substrate 21a and the support substrate 114 may be a sapphire substrate.

Figure 3D:
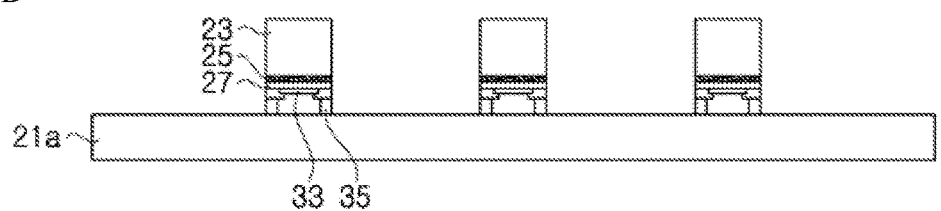

Referring to FIG. 3D, with the semiconductor layers coupled to the first substrate, the growth substrate 21 is removed from the semiconductor layers by laser lift-off (LLO) and the semiconductor layers 23, 25, and 27 are subjected to etching to isolate light emitting diodes 112 from each other. Here, etching for isolation of the individual light emitting diodes 112 may be performed by dry etching.

Figure 3E:
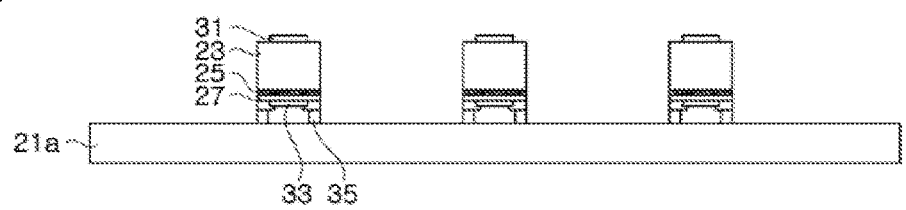
Figure 3F:
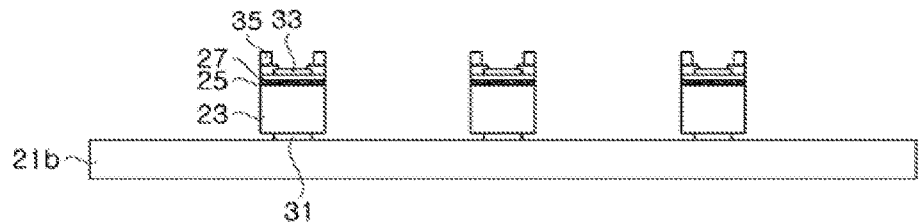

Referring to FIG. 3E, after isolation of the light emitting diodes 112 from each other, n-type electrodes 31 are formed on the n-type semiconductor layer 23. Here, the plurality of n-type electrodes 31 may be formed before or after the isolation of the light emitting diodes 112. Then, as shown in FIG. 3F, each of the light emitting diodes 112 is coupled to a second substrate 21b such that the n-type electrodes 31 can be coupled to the second substrate 21b, and then the first substrate 21a is removed. The second substrate 21b may be the same kind of substrate (e.g., a sapphire substrate) as the first substrate 21a.

Figure 3G:
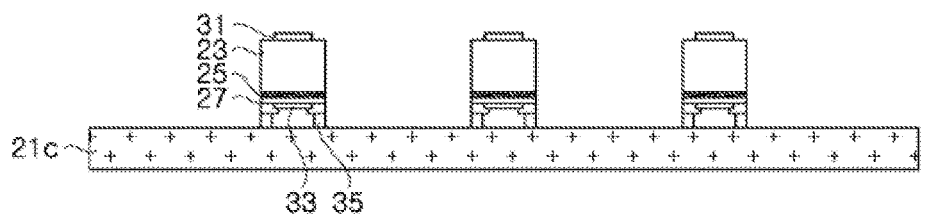
Figure 3H:
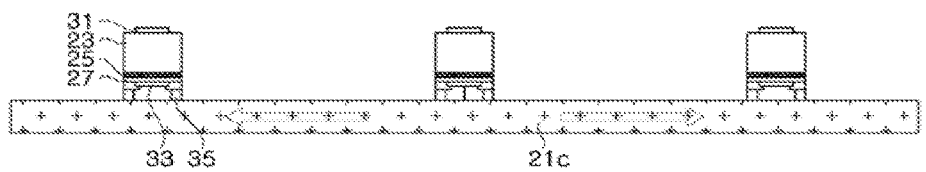

Referring to FIG. 3G, each of the light emitting diodes 112 is coupled to a third substrate 21c such that the wall portion 35 can be coupled to the third substrate 21c, and then the second substrate 21b is removed. The third substrate 21c may be a stretchable sheet which can be stretched or shrunk in a horizontal direction in cross-sectional view or any direction in plan view. Accordingly, as shown in FIG. 3H, it is possible to extend the distance between the respective light emitting diodes 112 by increasing the stretchable third substrate 21c or change the alignment of the light emitting diodes 112 in respective rows or columns.

Figure 3I:
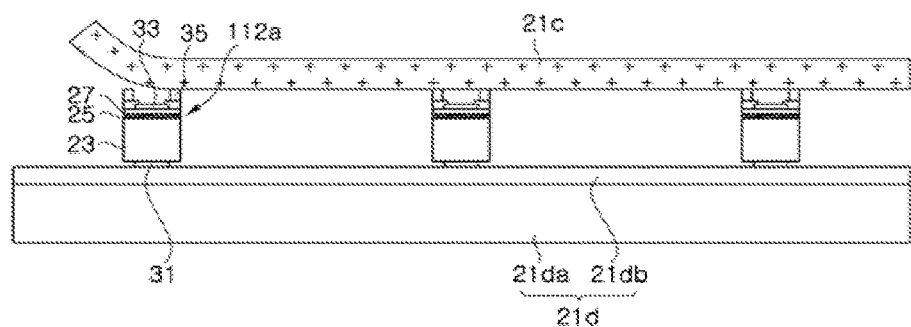

Then, with the distance between the respective light emitting diodes 112 extended or reduced, each of the light emitting diodes 112 is coupled to a fourth substrate 21d such that the n-type electrode 31 can be coupled to the fourth substrate 21d, as shown in FIG. 3I. Accordingly, the distance between the respective light emitting diodes 112 set by adjusting the stretchable third substrate 21c may be maintained by coupling the n-type electrode 31 to the fourth substrate 21d. The fourth substrate 21d may include a base 21da having flexibility and an adhesive layer 21db formed on the base 21da.

Figure 3J:
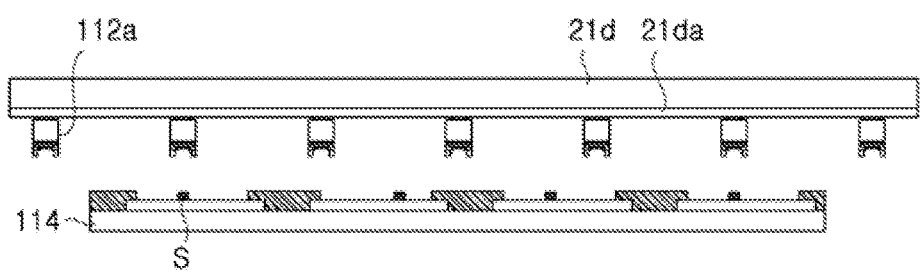

In this way, a plurality of light emitting diodes 112 arranged on the fourth substrate 21d is coupled to a support substrate 114, as shown in FIG. 3J, in which the support substrate 114 may be formed with a bonding portion S at locations where the light emitting diodes 112 are disposed. With transparent electrodes 116 and a blocking portion 118 formed on the support substrate 114, the bonding portion S is formed at the locations of the support substrate where the light emitting diodes 112 will be mounted. Accordingly, even when the plural light emitting diodes 112 coupled to the fourth substrate 21d are entirely transferred to the support substrate 114, the light emitting diodes 112 can be transferred only to the locations where the bonding portion S is formed on the support substrate 114.

Figure 3K:
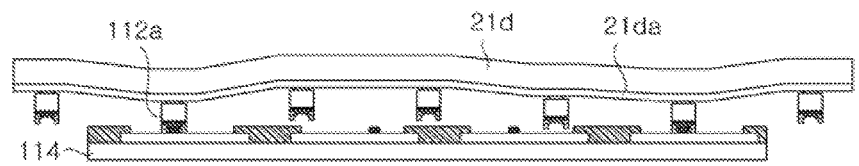

Referring to FIG. 3K, among the light emitting diodes 112 coupled to the fourth substrate, only the light emitting diodes 112 corresponding to the locations where the bonding portion S is formed on the support substrate 114 can be coupled to the support substrate 114 by application of external force. Accordingly, as shown in FIG. 3L, the light emitting diodes 112 can be coupled only to the locations where the bonding portion S is formed.

Further, although not illustrated in this exemplary embodiment, when external force is selectively applied only to desired light emitting diodes 112 on the fourth substrate 21d, on which the plurality of light emitting diodes 112 is arranged, so as to be bonded to the support substrate 114, as shown in FIG. 3K, the stretchable third substrate 3c having flexibility can be omitted. That is, when a flexible fourth substrate 21d is used instead of the second substrate 21b as shown in FIG. 3F, the light emitting diodes 112 can be selectively coupled to the support substrate 114 by application of external force, as shown in FIG. 3K.

Figure 3L:
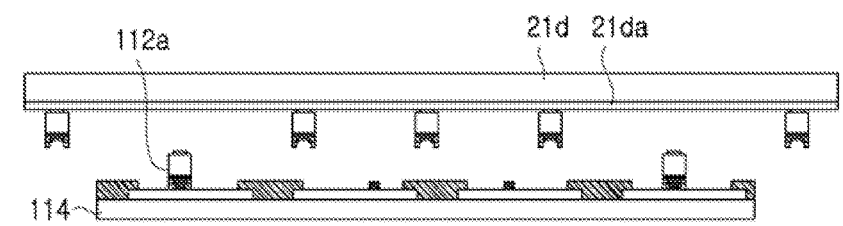

In this exemplary embodiment, a process of mounting the light emitting diodes 112 on the support substrate 114 as shown in FIG. 3L will be described with reference to FIGS. 4A-4G, in which a blue light emitting diode 112a, a green light emitting diode 112b, and a red light emitting diode 112c are mounted on the support substrate 114. The processes of manufacturing the blue light emitting diode 112a, the green light emitting diode 112b, and the red light emitting diode 112c are the same as those shown in FIGS. 3A to 3I.

Figure 4A:
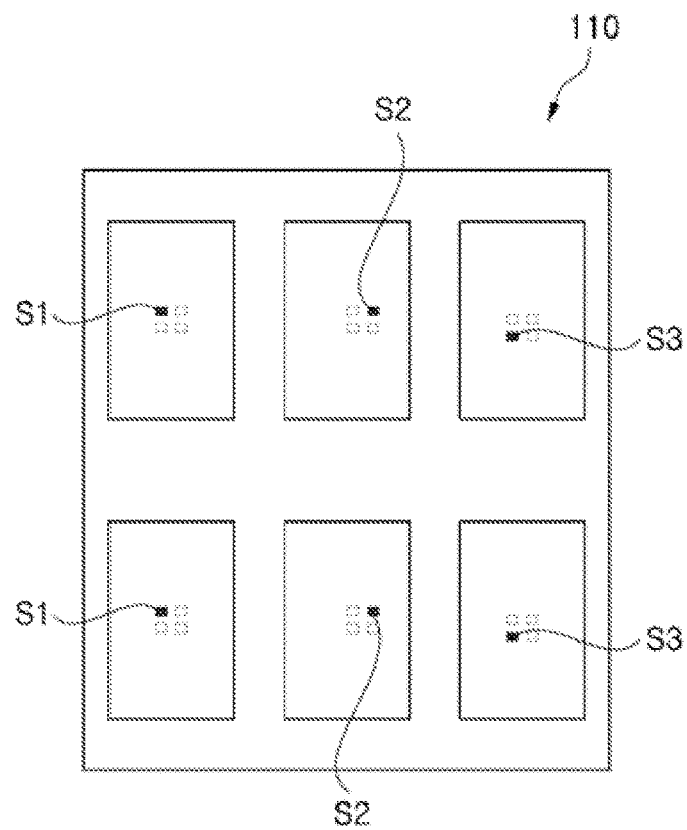
FIGS. 4A, 4B, 4C, 4D, 4E, 4F, and 4G are plan views illustrating a method of manufacturing the light emitting diode part of the display apparatus according to the first exemplary embodiment of the present disclosure.

Like FIG. 3J, FIG. 4A shows the bonding portion S formed on the support substrate 114, in which the bonding portion S is formed at all locations at which the blue light emitting diode 112a, the green light emitting diode 112b, and the red light emitting diode 112c are coupled. The bonding portion S may be divided into a first bonding portion S1, a second bonding portion S2, and a third bonding portion S3. The first bonding portion S1 is provided to couple the blue light emitting diode 112a to the support substrate and the second bonding portion S2 is provided to couple the green light emitting diode 112b thereto. Further, the third bonding portion S3 is provided to couple the red light emitting diode 112c.

The temperatures at which the first to third bonding portions S1, S2, S3 are bonded may be different from each other. The temperature at which the first bonding portion S1 is bonded is the highest temperature, and the temperature at which the third bonding portion S3 is bonded is the lowest temperature. For example, the bonding temperature of the first bonding portion S1 using silver-tin (AgSn) is about 230° C., and the bonding temperature of the second bonding portion S2 using zinc-tin (ZnSn) is about 198° C. The bonding temperature of the third bonding portion S3 using indium (In) is about 157° C. In this way, the bonding temperatures of the first to third bonding portions S1, S2, and S3 are different since the light emitting diodes 112 are bonded to the bonding portion S according to a predetermined sequence.

Since the blue light emitting diode 112a is first bonded to the support substrate 114, the bonding temperature of the first bonding portion S1 is the highest. Thus, since the bonding temperature of the bonding portion S2 is higher than that of the second bonding portion S2 or the third bonding portion S3, the first bonding portion S1 can be kept in a bonded state during bonding of the green light emitting diode 112b or the red light emitting diode 112c.

Figure 4B:
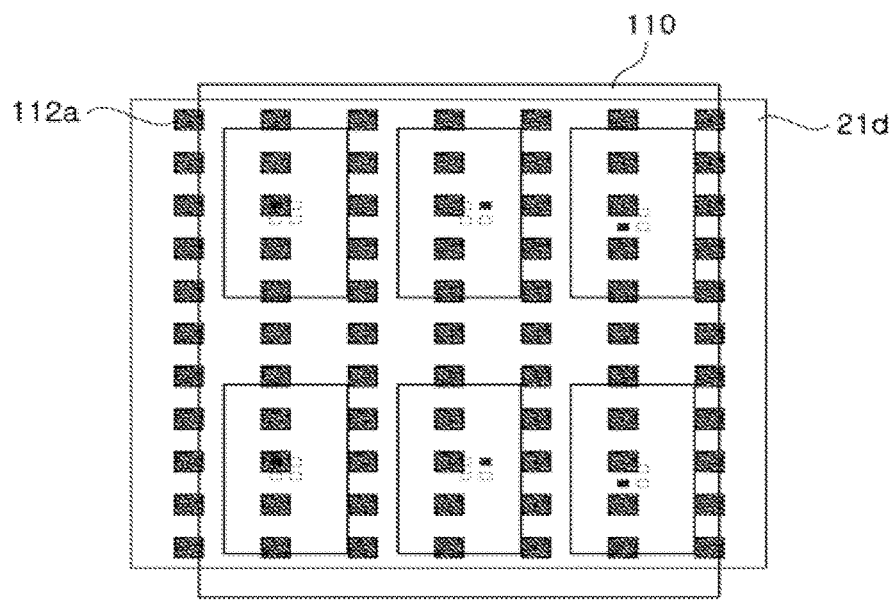

With the first to third bonding portions S1, S2, S3 formed on the support substrate 114, as shown in FIG. 4A, a fourth substrate 21d on which the blue light emitting diodes 112a are formed is disposed at a corresponding location on the support substrate 114 and the blue light emitting diodes 112a are bonded to the support substrate 114, as shown in FIG. 4B. At this time, the blue light emitting diodes 112a formed on the fourth substrate 21d are spaced farther apart from each other by a stretching substrate corresponding to a third substrate 21c than the blue light emitting diodes 112a formed on the growth substrate 21. Accordingly, the blue light emitting diodes 112a are not disposed at a location corresponding to the location of the second bonding portion S2 or the third bonding portion S3. Then, with the blue light emitting diodes 112a brought into contact with the first bonding portion S1, the first bonding portion S1 is heated to about 230° C., followed by lowering the temperature to bond the first bonding portion S1 to the blue light emitting diodes 112a such that the blue light emitting diodes 112a can be bonded to the support substrate 114.

Figure 4C:
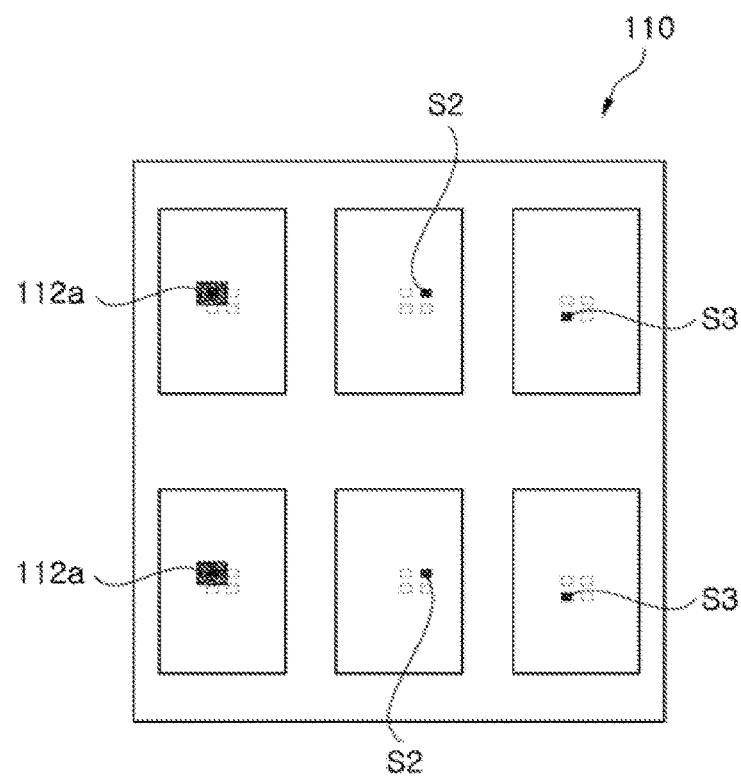
Figure 4D:
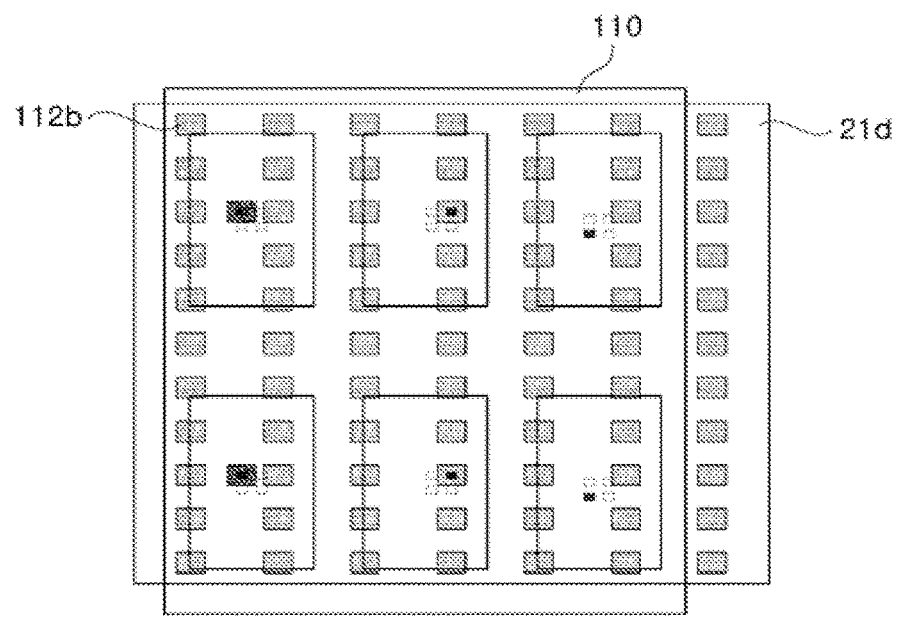

The state that the blue light emitting diodes 112a are bonded to the support substrate 114 is shown in FIG. 4C. As shown in FIG. 4D, a fourth substrate 4d on which the green light emitting diodes 112b are formed is disposed at a corresponding location on the support substrate 114 and the green light emitting diodes 112b are bonded to the support substrate 114. At this time, as described above, the green light emitting diodes 112b formed on the fourth substrate 21d are spaced farther apart from each other than the green light emitting diodes 112b formed on the growth substrate 21. Accordingly, even when the green light emitting diodes 112b are disposed at a location corresponding to the second bonding portion S2 formed on the support substrate 114, there can be no interference between the green light emitting diodes 112b and the blue light emitting diodes 112a previously bonded to the support substrate 114. Then, with the green light emitting diodes 112b brought into contact with the second bonding portion S2, the second bonding portion S2 is heated to about 198° C., followed by lowering the temperature to bond the second bonding portion S2 to the green light emitting diodes 112b. As a result, the green light emitting diodes 112b can be bonded to the support substrate 114.

Figure 4E:
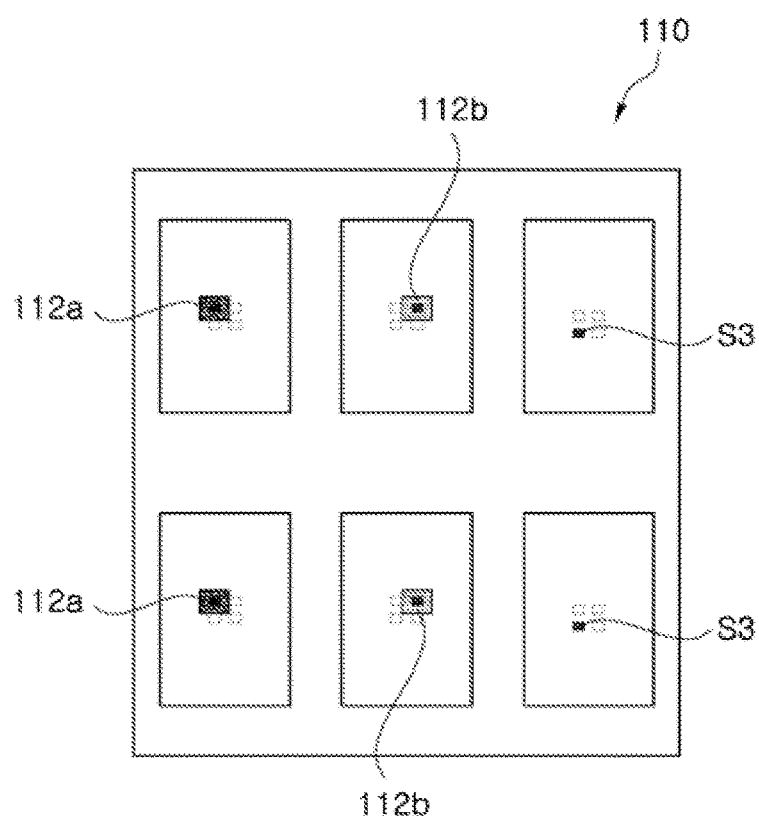
Figure 4F:
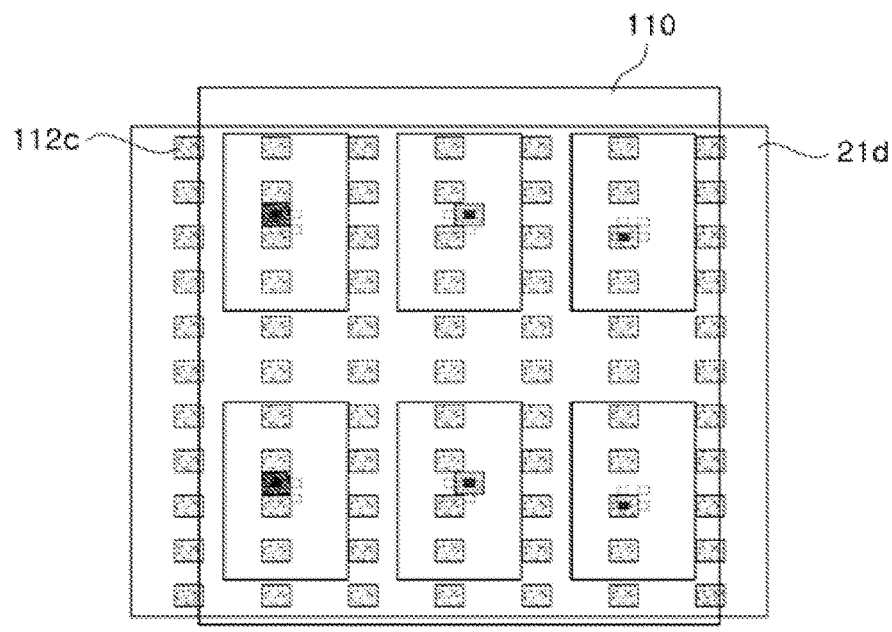

The state that the blue light emitting diodes 112a and the green light emitting diodes 112b are bonded to the support substrate 114 is shown in FIG. 4E. In this state, as shown in FIG. 4F, a fourth substrate 21d on which the red light emitting diodes 112c are formed disposed at a corresponding location on the support substrate 114 and the red light emitting diodes 112c are bonded to the support substrate 114. At this time, the distance between red light emitting diodes 112c formed on the support substrate 114 is also wide, thereby causing no interference between the blue light emitting diodes 112a or the green light emitting diodes 112b previously bonded to the support substrate 114. Then, with the red light emitting diodes 112c brought into contact with the third contact portion S3, the third bonding portion S3 is heated to about 157° C., followed by lowering the temperature to bond the third bonding portion S3 to the red light emitting diodes 112c such that the red light emitting diodes 112c can be bonded to the support substrate 114. The state that the blue light emitting diodes 112a, the green light emitting diodes 112b, and the red light emitting diodes 112c are bonded to the support substrate 114 is shown in FIG. 4G.

Here, each of the distances between the blue light emitting diodes 112a, the green light emitting diodes 112b, and the red light emitting diodes 112c formed on the different fourth substrates 21d may be at least two times the width of each of the light emitting diodes 112. In this way, the light emitting diodes 112 are bonded to the support substrate 114 in the state that the light emitting diodes 112 are separated from each other by a distance of at least two times the width of each light emitting diode 112, thereby preventing interference with other light emitting diodes 112.

Figure 3M:
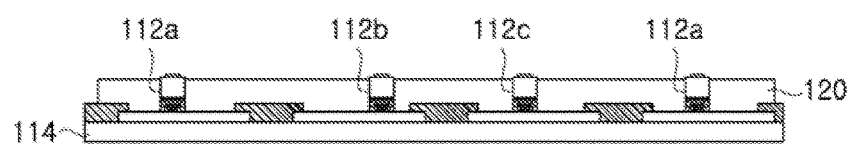
Figure 4G:
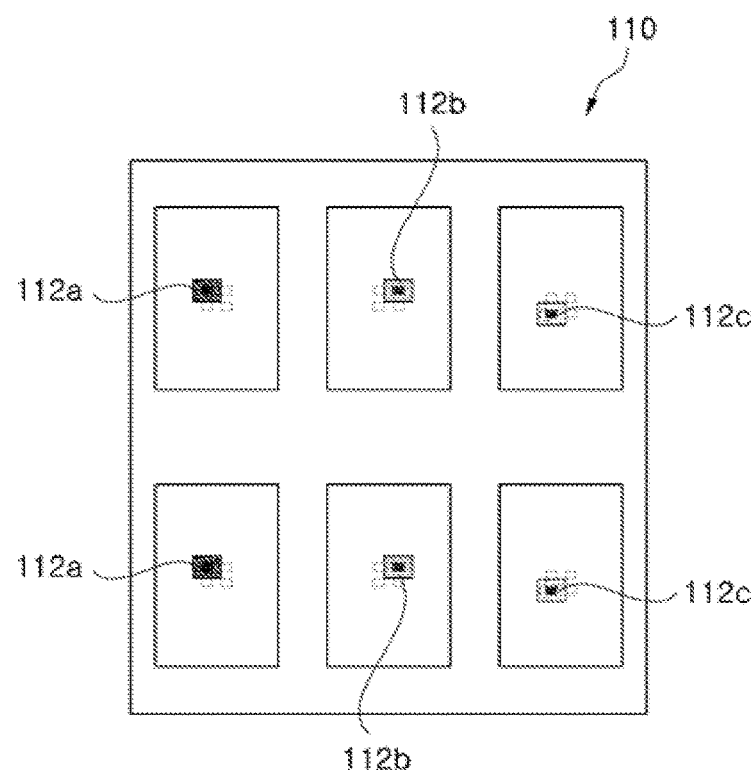

FIG. 3M is a sectional view corresponding to the plan view of FIG. 4G. That is, as shown in FIG. 3M, the blue light emitting diodes 112a, the green light emitting diodes 112b, and the red light emitting diodes 112c may be bonded to the support substrate 114. Then, as shown in FIG. 3M, an insulation layer 120 may be formed to cover substantially the entirety of each of the light emitting diodes 112 excluding a portion thereof. The insulation layer 120 is formed to cover both the transparent electrode 116 and the blocking portion 118 while surrounding each of the light emitting diodes 112. As a result, it is possible to prevent the transparent electrode 116 electrically connected to each of the light emitting diodes 112 from being exposed to the outside. In addition, an upper portion of the n-type semiconductor layer 23 and the n-type electrode 31 of each light emitting diode 112 may be exposed through an upper surface of the insulation layer 120.

Figure 3N:
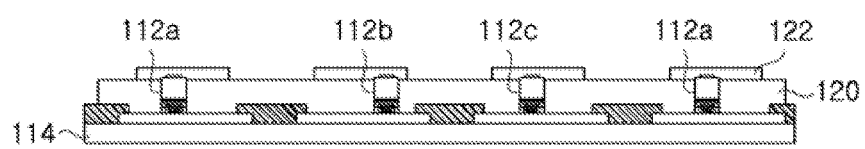

Then, as shown in FIG. 3N, with the n-type semiconductor layer 23 and the n-type electrode 31 exposed through the upper surface of the insulation layer 120, a first connection electrode 122 may be formed on the insulation layer 120 to cover the n-type semiconductor layer 23 and the n-type electrode 31.

Figure 3O:
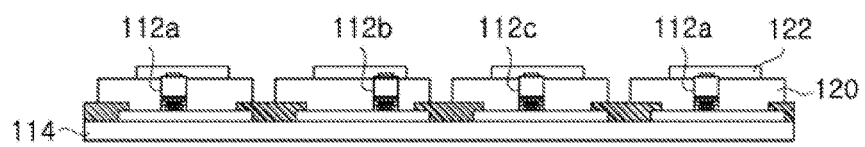

Then as shown in FIG. 3O, the insulation layer 120 is etched to expose an upper surface of the blocking portion 118. As a result, the light emitting diode part 110 according to the exemplary embodiment can be manufactured.

Figure 3P:
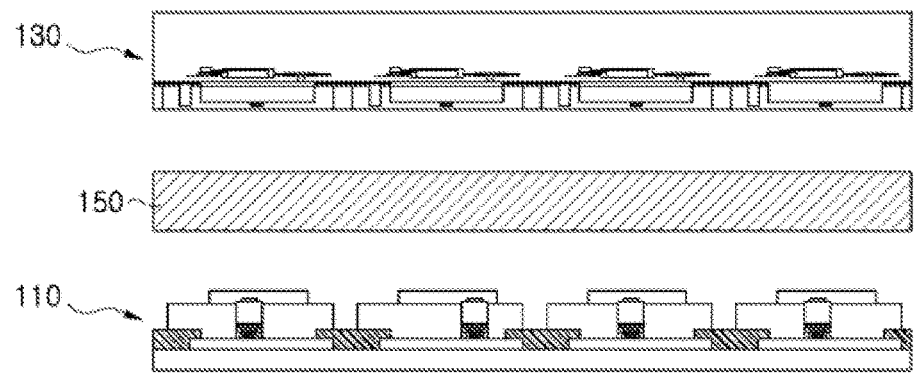

Next, as shown in FIG. 3P, the manufactured light emitting diode part 110 is bonded to a TFT panel 130 via an anisotropic conductive film 150, thereby providing the display apparatus 100 according to this exemplary embodiment, as shown in FIG. 1.

Figure 5:
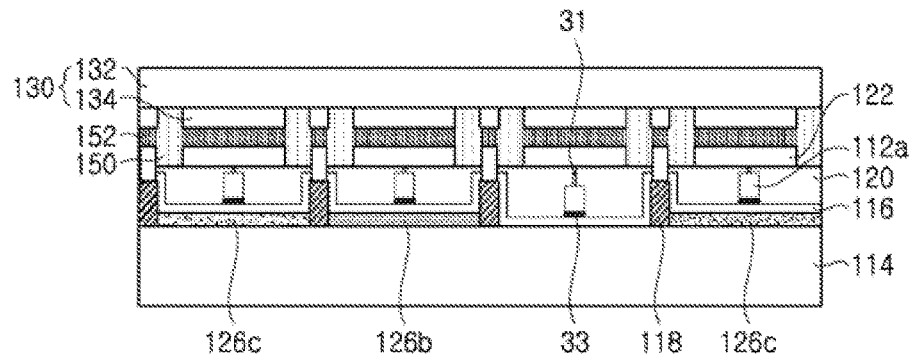
FIG. 5 is a schematic sectional view of a display apparatus according to a second exemplary embodiment of the present disclosure.

FIG. 5 is a schematic sectional view of a display apparatus according to a second exemplary embodiment of the present disclosure.

Referring to FIG. 5, a display apparatus 100 according to the second exemplary embodiment includes a light emitting diode part 110, a TFT panel unit 130, and an anisotropic conductive film 150. In description of the second exemplary embodiment, the same or similar descriptions as in the first exemplary embodiment will be omitted.

The light emitting diode part 110 includes blue light emitting diodes 112a, a support substrate 114, transparent electrodes 116, a blocking portion 118, an insulation layer 120, first connection electrodes 122, and phosphor layers 126.

Although the support substrate 114 may be formed in the same manner as in the first embodiment, the support substrate 114 may be formed as a transparent substrate so as to allow light emitted from blue light emitting diodes 112a to pass therethrough while supporting the blue light emitting diodes 112a in this exemplary embodiment.

In this exemplary embodiment, the blocking portion 118 may be formed on the support substrate 114 and an upper surface of the support substrate 114 may be divided into a plurality of zones by the blocking portion 118. The plurality of zones may be sub-pixel regions. A plurality of phosphor layers 126 may be formed on the support substrate 114 to cover the sub-pixels formed on the upper surface of the support substrate 114.

The phosphor layers 126 may include a green phosphor layer 126b and a red phosphor layer 126c, in which the green phosphor layer 126b may be formed on one of three sub-pixels, the red phosphor layer 126c may formed on another sub-pixel, and no phosphor layer may be formed on the third sub-pixel with reference to three sub-pixels. In this structure, the green phosphor layer 126b converts blue light emitted from the blue light emitting diodes 112a into green light and the red phosphor layer 126c converts blue light emitted from the blue light emitting diodes 112a into red light. In the sub-pixel on which the phosphor layer is not formed, blue light emitted from the blue light emitting diodes 112a may be emitted as is (i.e., without being converted by a phosphor layer).

Then, with the phosphor layers 126 disposed on the support substrate, the plurality of transparent electrodes 116 may be formed on the plurality of phosphor layers 126. The plurality of transparent electrodes 116 are formed on the overall upper surface of the support substrate 114 so as to cover the blocking portion 118, the plurality of phosphor layers 126, and regions of the support substrate 114 in which the phosphor layers 126 are not formed.

The plurality of transparent electrodes 116 may include indium-tin-oxide (ITO) and indium-zinc-oxide (IZO). The plurality of transparent electrodes 116 may be a carbon nanotube film, a graphene film, a transparent conductive polymer film such as poly(ethylenedioxythiophene) (PE-DOT), and the like. The plurality of transparent electrodes 116 may include any one of polyaniline, polyacetylene, polypyrrole, and polythiophene.

In addition, the plurality of blue light emitting diodes 112a are mounted on the plurality of transparent electrodes 116. Each of the plurality of blue light emitting diodes 112a is mounted such that a p-type electrode 33 is electrically connected to a transparent electrode 116, and an n-type electrode 31 is disposed on the surface of the blue light emitting diode 112a opposite the surface of the blue light emitting diode 112a on which the p-type electrode 33 is disposed.

The insulation layer 120 is formed to cover the entirety of the blue light emitting diode 112a and the transparent electrode 116 such that only the n-type electrode 31 is exposed through the insulation layer 120. The first connection electrode 122 is formed so as to electrically contact the n-type electrode 31 exposed on the insulation layer 120. Here, the first connection electrode 122 may include a reflective surface to reflect blue light emitted from the blue light emitting diode 112a toward the support substrate 114.

Then, the TFT panel 130 having a plurality of second connection electrodes 134 formed on one surface thereof is coupled to the light emitting diode part 110 by the anisotropic conductive film 150 after formation of the light emitting diode part 110 as described above. Accordingly, the anisotropic conductive film 150 electrically connects the plurality of first connection electrodes 122 to the plurality of second connection electrodes 134 via the electrode connection portion 152.

Figure 6A:
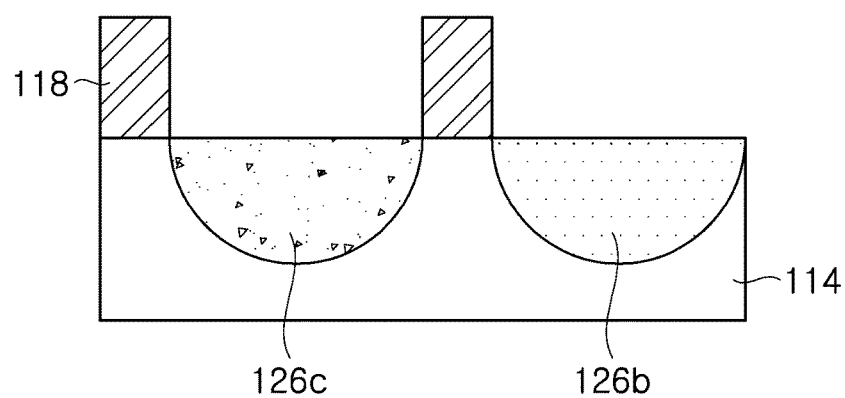
FIGS. 6A and 6B are schematic sectional views of a phosphor layer of a display apparatus according to a third exemplary embodiment of the present disclosure.
Figure 6B:
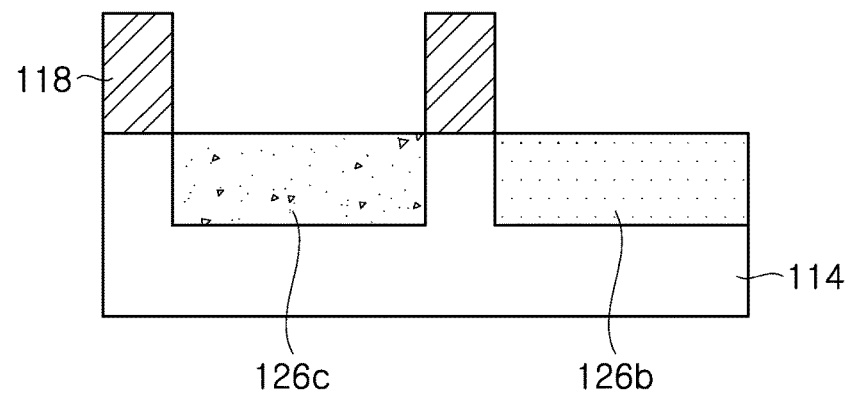

FIGS. 6A and 6B are a schematic sectional view of a phosphor layer of a display apparatus according to a third exemplary embodiment of the present disclosure.

Referring to FIGS. 6A and 6B, the display apparatus 100 according to this embodiment has the same structure as that of the second embodiment except that the phosphor layer is formed in grooves of the support substrate 114 instead of being formed on the upper surface of the support substrate 114. Accordingly, descriptions of the same or similar features as those of the first and second exemplary embodiments will be omitted.

In this exemplary embodiment, the support substrate 114 may have a plurality of grooves formed on one surface thereof. The plurality of grooves may be regularly formed in a predetermined pattern and the plurality of blocking portions 118 may be formed in a region in which the grooves are not formed. Accordingly, the plurality of sub-pixels can be divided into a plurality of zones by the blocking portion 118 and the width of the grooves can be formed equal to the width of the sub-pixels.

In addition, the grooves may be formed in a concave or convex shape to have a non-polygonal shape such as the lens shape as shown in FIG. 6A, or may have polygonal shape such as the rectangular shape in a longitudinal cross-sectional view, as shown in FIG. 6A.

The plurality of grooves may be filled with the green phosphor layer 126b or the red phosphor layer 126c such that the upper surface of the support substrate 114 becomes coplanar.

Of course, as shown in FIG. 5, since the groove is not formed in a region in which the green phosphor layer 126b or the red phosphor layer 126c is not formed, blue light emitted from the blue light emitting diode 112a disposed in this region can be emitted to the outside through the support substrate 114 without a corresponding phosphor layer.

Figure 7:
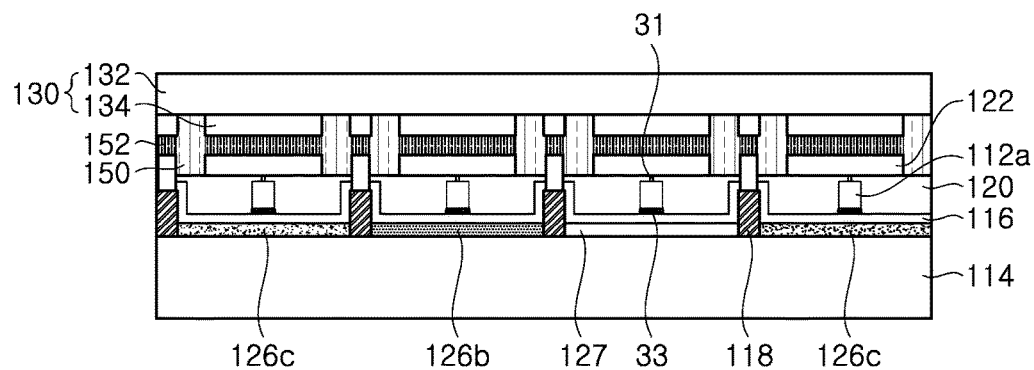
FIG. 7 is a schematic sectional view of a display apparatus according to a fourth exemplary embodiment of the present disclosure.

FIG. 7 is a schematic sectional view of a display apparatus according to a fourth exemplary embodiment of the present disclosure.

Referring to FIG. 7, a display apparatus 100 according to the fourth exemplary embodiment includes a light emitting diode part 110, a TFT panel 130, and an anisotropic conductive film 150. In the following description of the fourth exemplary embodiment, descriptions of the same or similar features as those of the first and second exemplary embodiments will be omitted.

The light emitting diode part 110 includes a plurality of blue light emitting diodes 112a, a support substrate 114, a transparent electrode 116, a blocking portion 118, an insulation layer 120, a plurality of first connection electrodes 122, and a plurality of phosphor layers 126.

In this exemplary embodiment, the light emitting diode part 110 may further include a transparent layer 127 in a region of the support substrate 114 of a sub-pixel, in which the green phosphor layer 126b or the red phosphor layer 126c is not formed. The transparent layer 127 may be formed to the same thickness as the green phosphor layer 126b and the red phosphor layer 126c and allow blue light emitted from the blue light emitting diode 112a to be directly transmitted towards the support substrate 114.

Accordingly, the plurality of transparent electrodes 116 formed on the green phosphor layer 126b, the red phosphor layer 126c, and the transparent layer 127 may be formed to have the same height in the respective sub-pixels, and the blue light emitting diodes 112a may also be mounted at the same height. That is, in this exemplary embodiment, since the blue light emitting diodes 112a are disposed at the same distance from the support substrate 114, it is possible to prevent a problem caused by a height difference of the various bonding portions S in a subsequent process, such as a transfer process.

Figure 8:
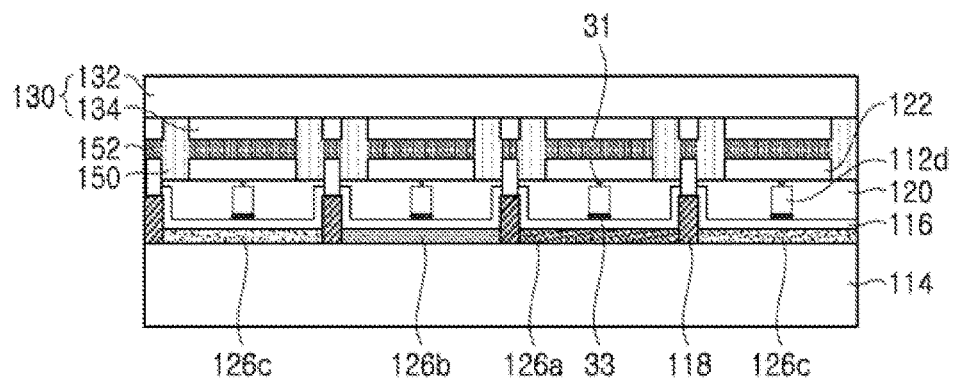
FIG. 8 is a schematic sectional view of a display apparatus according to a fifth exemplary embodiment of the present disclosure.

FIG. 8 is a schematic sectional view of a display apparatus according to a fifth exemplary embodiment of the present disclosure.

Referring to FIG. 8, a display apparatus 100 according to the fifth exemplary embodiment includes a light emitting diode part 110, a TFT panel 130, and an anisotropic conductive film 150. In the following description of the fifth exemplary embodiment, descriptions of the same or similar features as those of the first and second exemplary embodiments will be omitted.

The light emitting diode part 110 includes ultra violet (UV) light emitting diodes 112d, a support substrate 114, a plurality of transparent electrodes 116, a blocking portion 118, an insulation layer 120, a plurality of first connection electrodes 122, and a plurality of phosphor layers 126.

The display apparatus 100 according to this exemplary embodiment includes the UV light emitting diodes 112d.

Thus, a green phosphor layer 126b converts ultraviolet light emitted from the UV light emitting diodes 112d into green light and a red phosphor layer 126c converts UV light emitted from the UV light emitting diodes 112d into red light. Furthermore, the blue phosphor layer 126a converts UV light emitted from the UV light emitting diodes 112d into blue light.

In the above exemplary embodiment, since three sub-pixels form one pixel, one pixel emits blue light, green light, and red light.

Thus, in the light emitting diode part 110 according to this exemplary embodiment, a blue phosphor layer 126a, a green phosphor layer 126b, and a red phosphor layer 126c are formed together with the blocking portion 118 on the support substrate 114 and have the same thickness. The transparent electrodes 116 may be formed on the blue phosphor layer 126a, the green phosphor layer 126b, and the red phosphor layer 126c, respectively. Other features of this exemplary embodiment are the same as or similar to those of the fourth exemplary embodiment, and detailed descriptions thereof will be omitted.

Figure 9:
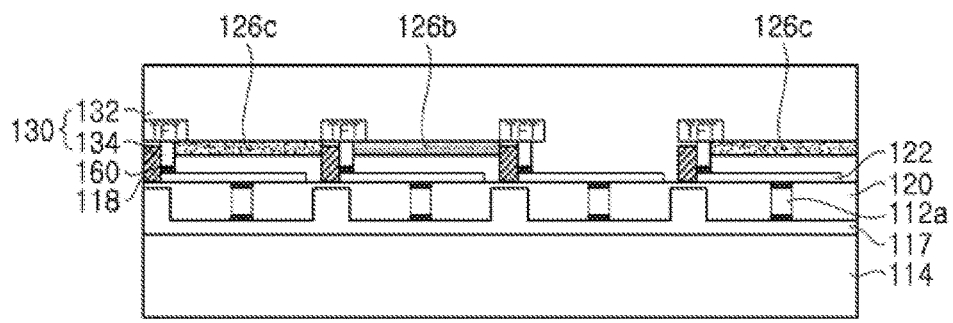
FIG. 9 is a schematic sectional view of a display apparatus according to a sixth exemplary embodiment of the present disclosure.
Figure 10A:
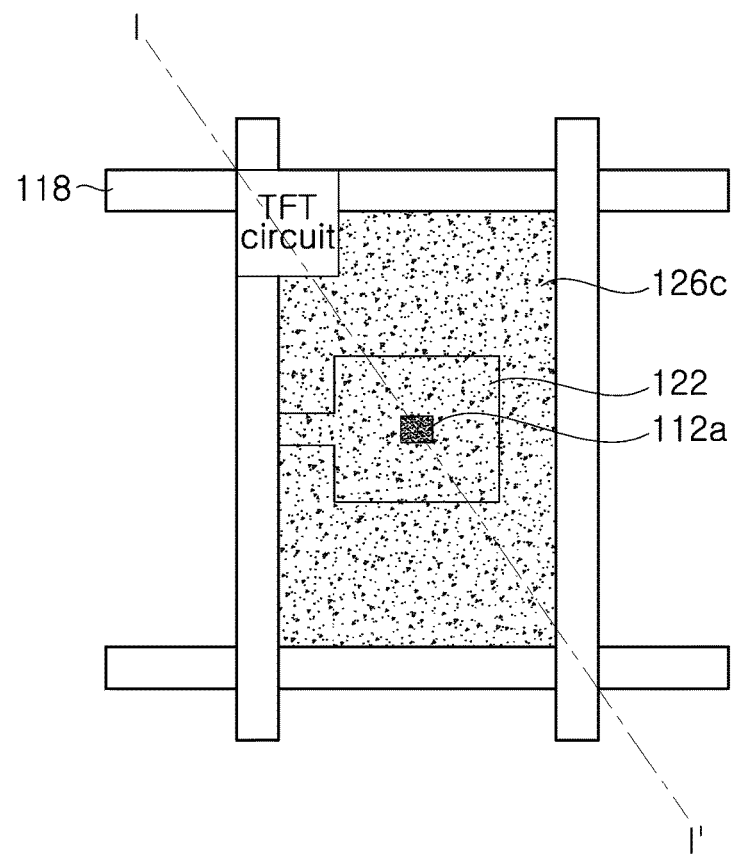
FIG. 10A is a schematic plan view of the display apparatus according to the sixth exemplary embodiment of the present disclosure.
Figure 10B:
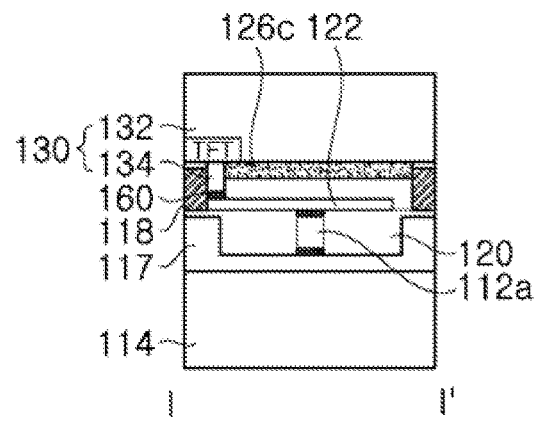
FIG. 10B is a schematic sectional view along sectional line I-I' of FIG. 10A.
Figure 11:
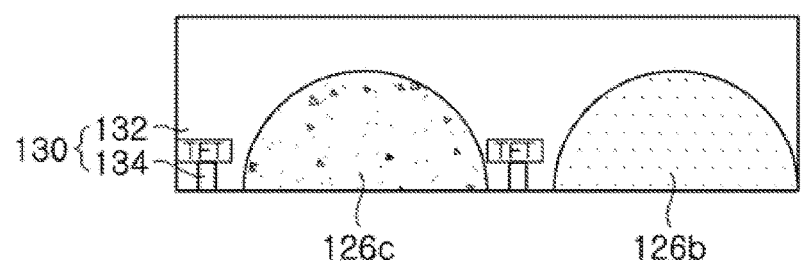
FIG. 11 is a schematic sectional view of a modified phosphor layer of the display apparatus according to the sixth exemplary embodiment of the present disclosure.

FIG. 9 is a schematic sectional view of a display apparatus according to a sixth exemplary embodiment of the present disclosure. FIG. 10A is a schematic plan view of the display apparatus according to the sixth exemplary embodiment of the present disclosure. FIG. 10B is a schematic sectional view along sectional line I-I' of FIG. 10A. FIG. 11 is a schematic sectional view of a modified phosphor layer of the display apparatus according to the sixth exemplary embodiment of the present disclosure.

Referring to FIG. 9, a display apparatus 100 according to the sixth exemplary embodiment includes a light emitting diode part 110 and a TFT panel 130. In the following description of the sixth exemplary embodiment, descriptions of the same or similar features as those of the first and second exemplary embodiments will be omitted.

The light emitting diode part 110 includes a plurality of light emitting diodes 112, a support substrate 114, an electrode 117, a blocking portion 118, an insulation layer 120, a plurality of first connection electrodes 122, and a plurality of phosphor layers 126.

A bottom electrode 117 may be formed on the support substrate 114. The bottom electrode 117 may be formed to cover the entirety of the support substrate 114 and may have a plurality of grooves open at an upper side thereof. The plurality of light emitting diodes 112 may be mounted within the plurality of grooves of the bottom electrode, and one groove may correspond to one sub-pixel. Further, in this exemplary embodiment, the bottom electrode 117 may be opaque and have a reflective surface may to reflect light emitted from the light emitting diodes 112 in an upward direction.

The bottom electrode 117 may include a stack structure of ITO-Ag-ITO, whereby diffusion and/or oxidation of the bottom electrode 117 can be prevented by ITO. In addition, the bottom electrode 117 may have a stack structure of Ti—Al—Ti, or a stack structure of Mo—Al—Mo-ITO.

As described above, one or more light emitting diodes 112 may be mounted within the plurality of grooves formed on the bottom electrode 117 such that the p-type electrode 33 of each of the light emitting diodes 112 can be electrically connected to the bottom electrode 117. Each of the light emitting diodes 112 may include an n-type electrode 31 formed on a surface opposite to a surface on which the p-type electrode 33 is formed. Here, the plurality of light emitting diodes 112 may be blue light emitting diodes that emit blue light or a plurality of UV light emitting diodes that emit UV light, or some combination thereof.

The insulation layer 120 may be formed on an upper surface of the bottom electrode 117 to cover the entirety of the light emitting diode 112. At this time, the n-type electrode 31 of each light emitting diode may be exposed through the insulation layer 120 instead of being covered by the insulation layer 120. The blocking portion 118 and the first connection electrodes 122 may be formed on an upper surface of the insulation layer 120. The blocking portion 118 is formed on the upper surface of the insulation layer 120 in a region that does not overlap the plurality of grooves of the bottom electrode 117. Thus, as in the second exemplary embodiment, the insulation layer 120 can be divided into plurality of zones by the blocking portion 118, and each of the zones may be a sub-pixel.

The first connection electrodes 122 may be formed to cover the insulation layer 120 in a plurality of zones divided by the blocking portion 118 such that each of the first connection electrode 122 is placed in a zone between the blocking portions 118, as shown in FIGS. 10A and 10B. At this time, each of the first connection electrodes 122 may be formed on an upper side of the light emitting diode 112 to be electrically connected to the n-type electrode 31 of the light emitting diode 112. Accordingly, the first connection electrodes 122 may be transparent so as to allow light emitted from the light emitting diodes 112 to pass through the first connection electrodes 122. Of course, the first connection electrodes 122 may be formed to cover the entirety of the sub-pixels.

Further, in this exemplary embodiment, a connection portion 160 may be formed near the blocking portion 118. The connection portion 160 bonds second connection electrodes 134 of the TFT panel 130 to the first connection electrodes 122 such that the first connection electrodes 122 are electrically connected to the second connection electrodes 134, respectively.

The TFT panel 130 includes a panel substrate 132 and the second connection electrodes 134, and may further include a TFT driving circuit formed therein and phosphor layers 126. The TFT driving circuit may be formed inside the panel substrate 132 and may be regularly arranged at constant intervals inside the panel substrate 132. In addition, as shown in FIG. 11, the TFT driving circuit may not overlap a groove of panel substrate.

The second connection electrodes 134 are electrically connected to the TFT driving circuit and may be formed under the TFT driving circuit, as shown in FIG. 9. As described above, the second connection electrodes 134 may be electrically connected to the first connection electrodes 122 by the connection portion 160, respectively.

In this exemplary embodiment, the plurality of light emitting diodes 112 may include blue light emitting diodes, and the plurality of phosphor layers may include a green phosphor layer 126b and a red phosphor layer 126c. In addition, a plurality of grooves formed on the panel substrate 132 may be filled with the green phosphor layer 126b or the red phosphor layer 126c. That is, the panel substrate 132 may have a plurality of grooves regularly formed on a surface corresponding to the light emitting diode part 110. The plurality of grooves may be formed in regions corresponding to sub-pixels of the light emitting diode part 110 at a location where the second connection electrodes 134 are not formed. The plurality of grooves thus formed may be filled with the green phosphor layer 126b or the red phosphor layer 126c.

The plurality of grooves formed on the panel substrate 132 are not formed at all locations corresponding to the sub-pixels and, since three sub-pixels form one pixel, the groove is not formed in a region corresponding to one of the three sub-pixels (e.g., the blue sub-pixel region). Accordingly, blue light emitted from the light emitting diodes 112 is converted into green light in one sub-pixel and is converted into red light in another sub-pixel. In the third sub-pixel, the blue light may be emitted to the panel substrate 132 without being subjected to wavelength conversion.

The plurality of grooves formed on the panel substrate 132 may have a rectangular shape in a longitudinal cross-sectional view, as shown in FIG. 9, or may have a concave shape as shown in FIG. 11.

On the other hand, the plurality of grooves may be formed on the panel substrate 132 so as to correspond to all of the sub-pixels, as needed, and, as in the fourth exemplary embodiment, the green phosphor layer 126b, the red phosphor layer 126c and the transparent layer 127 may be formed at locations corresponding to three sub-pixels, respectively.

Further, when the plurality of light emitting diodes 112 include UV light emitting diodes, the plurality of phosphor layers include a blue phosphor layer 126a, a green phosphor layer 126b, and a red phosphor layer 126c, and a plurality of grooves may be formed on the panel substrate 132 so as to correspond to all of the sub-pixels. As in the fifth exemplary embodiment, the blue phosphor layer 126a, the green phosphor layer 126b, and the red phosphor layer 126c may be formed at locations corresponding to three sub-pixels, respectively.

Figure 12A:
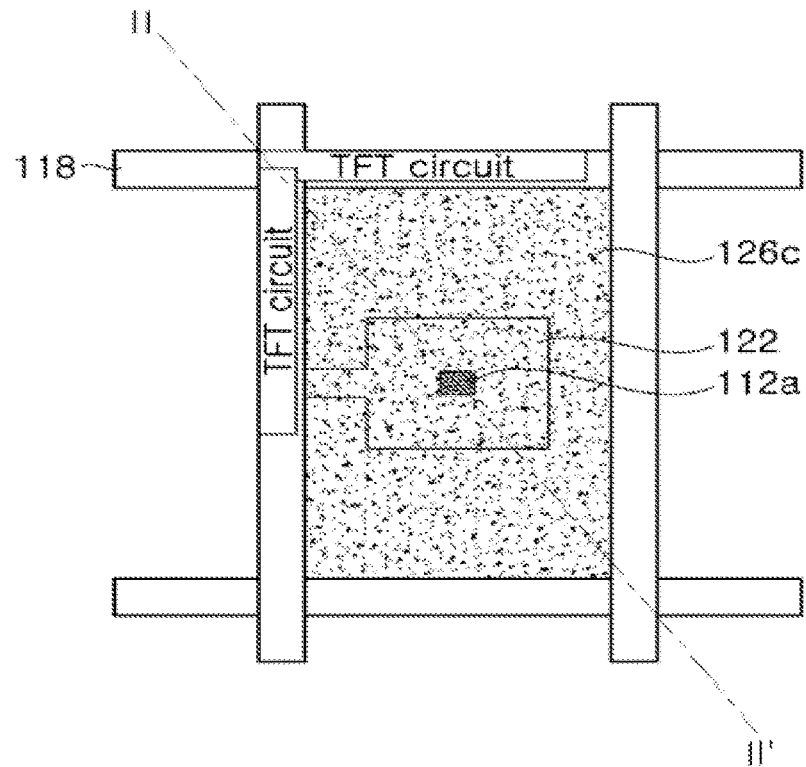
FIG. 12A is a schematic plan view of a display apparatus according to a seventh exemplary embodiment of the present disclosure.
Figure 12B:
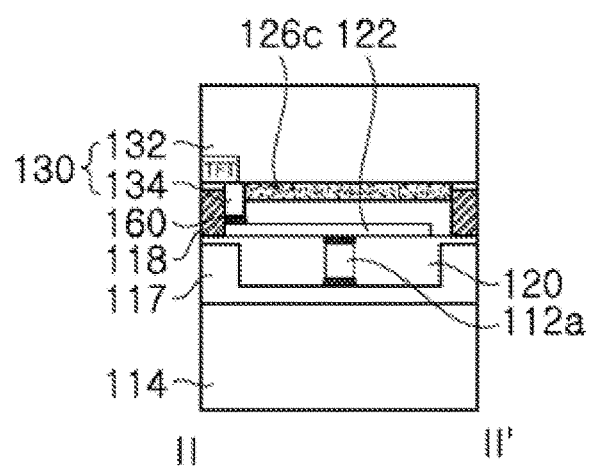
FIG. 12B is a schematic sectional view along sectional line II-II' of FIG. 12A.

FIG. 12 is a schematic plan view of a display apparatus according to a seventh exemplary embodiment of the present disclosure.

Referring to FIG. 12, a display apparatus 100 according to the seventh exemplary embodiment includes a light emitting diode part 110 and a TFT panel 130. In the following description of the seventh exemplary embodiment, descriptions of the same features as those of the first and sixth exemplary embodiments will be omitted.

The TFT panel 130 includes a panel substrate 132, a plurality of second connection electrodes 134, a TFT driving circuit, and a plurality of phosphor layers 126. The TFT driving circuit may be formed inside the panel substrate 132 and may be formed along a region outside of the sub-pixel regions of on the light emitting diode part 110. That is, the TFT driving circuit may be formed in a line shape along a region in which the groove of the bottom electrode 117 is not formed on the support substrate 114 of the light emitting diode part 110. Accordingly, the TFT driving circuit may not cover part of light emitted from the light emitting diodes 112 and the display apparatus 100 according to this exemplary embodiment may allow light to be emitted from the entirety of the sub-pixels.

Various exemplary embodiments described above employ a plurality of micro-light emitting diodes including nitride semiconductors. Using mirco-light emitting diodes including nitride semiconductors for each sub-pixel region for a display apparatus results in a high efficiency and high resolution display apparatus compared to conventional display apparatus. For example, exemplary embodiments described herein are suitable in reducing the power consumption of any type of display apparatus (e.g., a wearable apparatus that requires low power consumption).

Although some exemplary embodiments have been described with reference to the accompanying drawings, it should be understood that these embodiments are given by way of illustration only and various modifications, variations and alterations can be made by those skilled in the art without departing from the spirit and scope of the present disclosure. Therefore, the scope of the present disclosure should be interpreted according to the appended claims and equivalents thereof.

What is claimed is:

1. A display apparatus, comprising:
a light emitting diode part comprising:
a transparent support substrate;
a plurality of light emitting diodes regularly arranged on the support substrate; and
a plurality of phosphor layers disposed on the support substrate covering at a first portion of the plurality of light emitting diodes and configured to emit light through a conversion of introduced light;
a blocking portion disposed on the support substrate and interposed between the plurality of phosphor layers;
a plurality of transparent electrodes covering the plurality of phosphor layers and comprising portions disposed on each side surface of the blocking portion laterally adjacent to the plurality of light emitting diodes, the plurality of transparent electrodes electrically connected to the plurality of light emitting diodes; and
a TFT panel configured to drive the light emitting diode part.

2. The display apparatus according to claim 1, wherein:
the support substrate comprises a plurality of regions corresponding to a plurality of pixels, and
each light emitting diode is configured to emit light for 1000 pixels or less.

3. The display apparatus according to claim 1, wherein:
the plurality of light emitting diodes is a plurality of blue light emitting diodes configured to emit blue light, and
the plurality of phosphor layers comprises at least one of a green phosphor layer configured to emit green light through wavelength conversion of the blue light into green light and a red phosphor layer configured to emit red light through wavelength conversion of the blue light into red light.

4. The display apparatus according to claim 3, further comprising a transparent layer disposed on the support substrate covering a second portion of the plurality of light emitting diodes not covered by the plurality of phosphor layers.

5. The display apparatus according to claim 1, wherein:
the plurality of light emitting diodes is a plurality of ultra violet (UV) light emitting diodes configured to emit UV light, and
the plurality of phosphor layers comprises at least one of a blue phosphor layer configured to emit blue light through wavelength conversion of the UV light into blue light, a green phosphor layer configured to emit green light through wavelength conversion of the UV light into green light, and a red phosphor layer configured to emit red light through wavelength conversion of the UV light into red light.

6. The display apparatus according to claim 1, wherein the support substrate comprises a plurality of grooves formed on an upper surface thereof and the plurality of phosphor layers are disposed within the plurality of grooves, respectively.

7. The display apparatus according to claim 6, wherein each of the plurality of grooves has a polygonal cross-section.

8. The display apparatus according to claim 6, wherein each of the plurality of grooves has a non-polygonal cross-section.

\* \* \* \* \*